United States Patent [19]
Mitsuda

[11] Patent Number: 5,973,551
[45] Date of Patent: Oct. 26, 1999

[54] ABNORMAL CURRENT DETECTION CIRCUIT AND LOAD DRIVE CIRCUIT INCLUDING THE SAME

[75] Inventor: Tsuyoshi Mitsuda, Shiga, Japan

[73] Assignee: NEC Corporation, Tokyo, Japan

[21] Appl. No.: 09/087,636

[22] Filed: May 29, 1998

[30] Foreign Application Priority Data

May 30, 1997 [JP] Japan .................................. 9-141239

[51] Int. Cl.⁶ ............................................. G05F 1/10
[52] U.S. Cl. ................................................ 327/543; 327/77
[58] Field of Search ................................. 327/538, 540, 327/541, 543, 427, 77, 87, 88, 89, 322, 323, 327, 328, 331, 332

[56] References Cited

U.S. PATENT DOCUMENTS

| | | | |
|---|---|---|---|
| 5,113,089 | 5/1992 | Osawa ........................................ | 327/77 |
| 5,767,545 | 6/1998 | Takahashi ................................. | 327/427 |
| 5,796,278 | 8/1998 | Osborn et al. ........................... | 327/427 |
| 5,892,389 | 4/1999 | Lai ............................................ | 327/543 |
| 5,903,422 | 5/1999 | Hosokawa ................................. | 327/543 |
| 5,905,389 | 5/1999 | Alleven .................................... | 327/543 |

*Primary Examiner*—Toan Tran
*Attorney, Agent, or Firm*—Whitmam, Curtis & Whitham

[57] ABSTRACT

A detection circuit detects an abnormal current which flows through a first output transistor. In this event, the first output transistor is connected to an external power supply via a load resistor. The above detection circuit mainly includes a second transistor, a constant current supply, a third transistor, a fourth transistor, and a comparator circuit. The constant current supply supplies a constant current into the second transistor. Further, the third transistor is connected to the first output transistor and performs an ON-OFF operation in synchronism with the first output transistor. On the other hand, the fourth transistor is connected to the third transistor in serial and performs the ON-OFF operation opposite to the first output transistor. Moreover, the comparator circuit has a first input and a second input. In this event, a first connection point between the second transistor and the constant current supply is connected to the first input while a second connection point between the third transistor and the fourth transistor is connected to the second input.

16 Claims, 4 Drawing Sheets

ABNORMAL CURRENT DETECTION CIRCUIT AND LOAD DRIVE CIRCUIT INCLUDING THE SAME

BACKGROUND OF THE INVENTION

This invention relates to a load drive circuit for use in driving a load which is to be connected to the load drive circuit and, in particular, to an abnormal current detection circuit which is used in the load drive circuit to detect an abnormal current which flows through an output transistor included in the load drive circuit to drive the load.

Conventionally, a load drive circuit of the type described is coupled to a load to drive the same. In this event, the load is turned on or off by the load drive circuit. Specifically, an output transistor which is included in the load drive circuit and which is connected to the load is turned off when an abnormal current is caused to flow through the output transistor. Otherwise, the output transistor is kept at an on-state.

In order to detect such an abnormal current, an abnormal current detection circuit is usually arranged in the load drive circuit to detect the abnormal current and to keep the output transistor at an off-state when the abnormal current is caused to flow through the output transistor. For this purpose, a comparator is used in the abnormal current detection circuit and coupled to a control circuit which controls the output transistor. With this structure, the control circuit turns off the output transistor when the abnormal current is detected by the comparator. In this case, the comparator compares a reference voltage with a comparison voltage which results from a current which is similar to that flowing through the output transistor and which is caused to flow through a resistor coupled to the comparator.

In the meanwhile, it is noted here that such a load drive circuit may be generally implemented by a semiconductor integrated circuit together with the resistor by the use of a semiconductor integration techniques. When the resistor is formed within a substrate by the integration technique, a variation of resistance inevitably takes place in the resistor and brings about a variation of the comparison voltage. In consequence, a level of the abnormal current is fluctuated from one to another in the abnormal current detection circuit which includes the resistor formed by the semiconductor integration technique.

On the other hand, consideration would be made about replacing the resistor by a transistor on manufacturing the abnormal current detection circuit by the semiconductor integration technique. In this event, switching transistors would be connected to the output transistor along with the transistor substituted for the resistor. This structure gives rise to an increase of the switching transistors together with the output transistor. Such an increase of the switching transistors would result in occurrence of a glitch or noise which lasts for a very short term at a transition of an input signal or a control signal.

SUMMARY OF THE INVENTION

It is therefore an object of this invention to provide an abnormal current detection circuit which can accurately detect an abnormal current flowing through an output transistor.

It is another object of this invention to provide a load drive circuit which includes the abnormal current detection circuit mentioned above.

It is still another object of this invention to provide an abnormal current detection circuit of the type described, which can reduce an influence of a variation of a comparison voltage due to a variation of a resistor.

It is yet another object of this invention to provide an abnormal current detection circuit of the type described, which is capable of avoiding occurrence of a noise resulting from switching operation.

According to this invention, a detection circuit detects an abnormal current which flows through a first output transistor. In this event, the first output transistor is connected to an external power supply via a load resistor.

The above detection circuit mainly includes a second transistor, a constant current supply, a third transistor, a fourth transistor, and a comparator circuit.

In this event, the second transistor is connected to a power supply. The constant current supply supplies a constant current into the second transistor in accordance with a lower limit for determining a current which flows through the first output transistor as the abnormal current.

Further, the third transistor is connected to the first output transistor and performs an ON-OFF operation in synchronism with the first output transistor. On the other hand, the fourth transistor is connected to the third transistor in serial and performs the ON-OFF operation opposite to the first output transistor.

Moreover, the comparator circuit has a first input and a second input. In this event, a first connection point between the second transistor and the constant current supply is connected to the first input while a second connection point between the third transistor and the fourth transistor is connected to the second input.

DESCRIPTION OF THE PREFERRED EMBODIMENT

Figure 1:
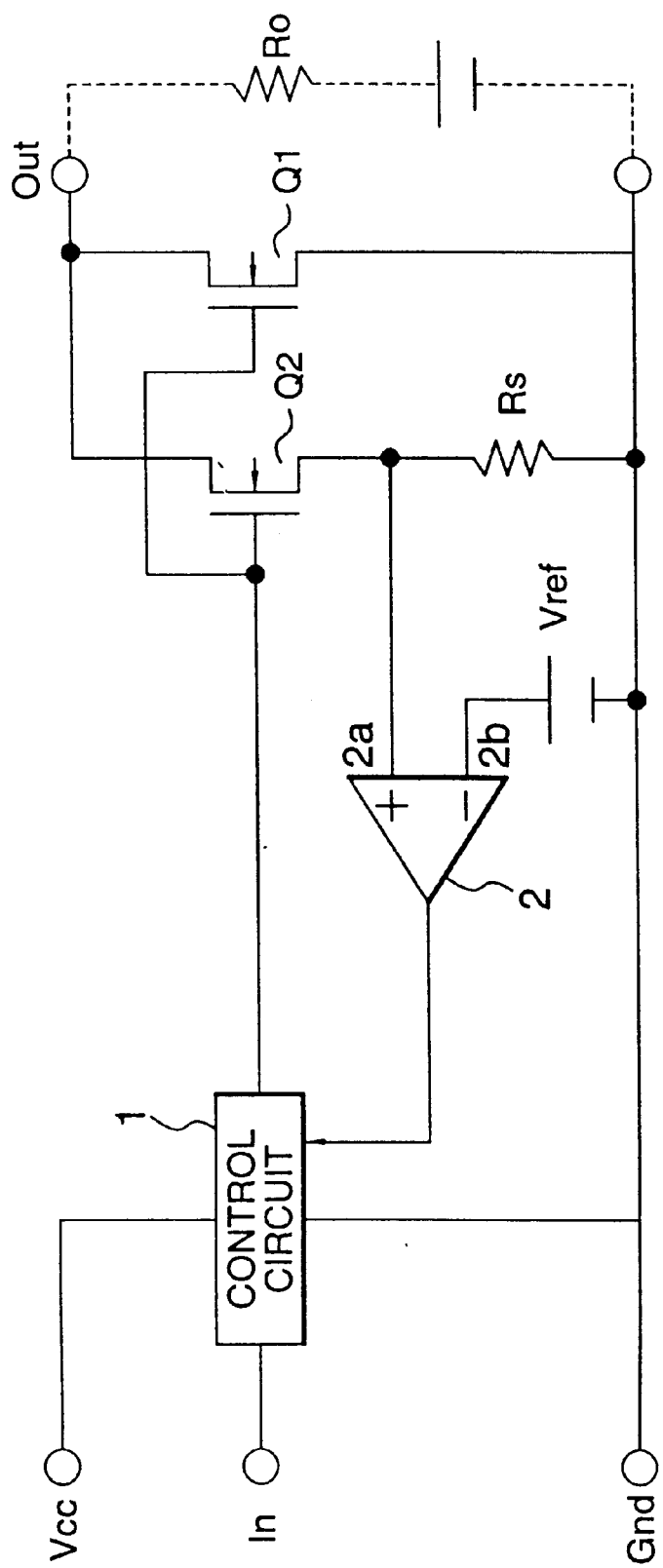
FIG. 1 is a circuit diagram showing a conventional load drive circuit including an abnormal current detection circuit.

Referring to FIG. 1, a conventional load drive circuit including an abnormal current detection circuit will be first described for a better understanding of this invention. The load drive circuit is equivalent to the conventional load drive circuit mentioned in the preamble of the instant specification.

As illustrated in FIG. 1, a load drive circuit mainly includes a control circuit 1, a comparator circuit 2, a current detection transistor Q2, a current detection resistor Rs, and an output transistor Q1. In this event, the control circuit 1 is connected between a power supply Vcc and a ground terminal and, respectively. Further, the control circuit 1 is given an input signal and an output signal of the comparator circuit 2. In the case, the comparator circuit has a first input 2a and a second input 2b.

Herein, the first input 2a is connected to a point of connection between the current detection transistor Q2 and the current detection resistor Rs while the second input 2b is connected to a reference voltage Vref.

The output transistor Q1 of an N-channel type has a drain connected to an output terminal Out to be connected to via a load resistor R0. In the illustrated example, the drain of the output transistor Q1 is connected in common with to the drain of the current detection transistor Q2 while the gate of the output transistor Q1 is also connected in common with the gate of the current detection transistor Q2. Further, the current detection resistor Rs is connected between the source of the current detection transistor Q2 and the ground terminal Gnd.

As mentioned before, the abnormal current detection circuit is composed of the comparator circuit 2, the current detection transistor Q2 and the current detection resistor Rs. In this event, the control circuit 1 operates on the basis of the power supply Vcc.

More specifically, when the output signal from the comparator circuit 2 is put into a low level (thereinafter, abbreviated to a L level), the control circuit 1 outputs a signal corresponding to the input signal which is given to an input terminal In, and supplies the corresponding signal to the gate terminal of the output transistor Q1. Thereby, the output transistor Q1 carries out an ON-OFF control operation.

On the other hand, when the output signal from the comparator circuit 2 is put into a high level (thereinafter, abbreviated to an H level), the control circuit 1 outputs the L level to turn off the output transistor Q1 irrelevant to the input signal from the input terminal In.

Herein, it is to be noted that the output transistor Q1 is formed by an N-channel MOSFET. In this event, the source terminal thereof is grounded while the drain terminal is connected to the output terminal Out, as mentioned before. The output terminal Out is connected to the external power supply via the load resistor R0. Further, the output transistor Q1 is connected to the current detection transistor Q2 so that the drains and the gates are commonly connected to each other. Herein, the output transistor Q1 is manufactured simultaneously with the current detection transistor Q2 through the same process and has similarity to the current detection transistor Q2 in characteristic (namely, the characteristics per channel width are similar to each other).

Moreover, the source terminal of the current detection transistor Q2 is grounded via the current detection resistor Rs. In this case, the current detection resistor Rs has a low resistance value.

Further, the two transistors are connected to each other to form a mirror circuit which is known in the art. With such a mirror circuit, currents caused to flow through both the transistors are determined by their areas, namely, channel widths and channel lengths are proportional to each other.

Under this circumstance, the comparator circuit 2 compares the voltage of the connection point between the current detection transistor Q2 and the current detection resistor Rs with the reference voltage Vref. As the result of the comparison, when the voltage of the connection point is higher than the reference voltage Vref, the comparator circuit 2 outputs the H level. On the other hand, when the voltage of the connection point is lower than the reference voltage Vref, the comparator outputs the L level.

Under this condition, when a normal current flows through the output transistor Q1 on the condition that the load resistor R0 and the external power supply are normal, the current corresponding to the mirror ratio flows through the current detection transistor Q2. Consequently, the corresponding voltage is generated at the connection point between the current detection transistor Q2 and the current detection resistor Rs.

On the other hand, when the current which flows through the output transistor Q1 becomes large on the condition that the load resistor R0 and the external power supply are abnormal, the voltage at the connection point also becomes large.

Therefore, if the voltage value at this connection point is selected as the reference voltage for determining the abnormality, the comparator circuit 2 outputs the H level when the current of the output transistor Q1 becomes abnormally large. Consequently, the control circuit 1 puts the gate voltage of the output transistor Q1 into the L level in response to the corresponding signal. Thereby, a protection circuit is structured so as to cut off the output transistor Q1.

However, accuracy of a lower limit value of the current which is detected as the abnormality largely depends upon accuracy of the current detection resistor Rs. In this case, there is a limit for reducing variation in manufacturing the current detection resistor Rs. Consequently, the accuracy of the abnormal current detection circuit is inevitably reduced.

Taking the above-mentioned problem into consideration, this invention to provide an abnormal current detection circuit which is capable of reducing variation of a detection limit value due to manufacturing variation.

Figure 2:
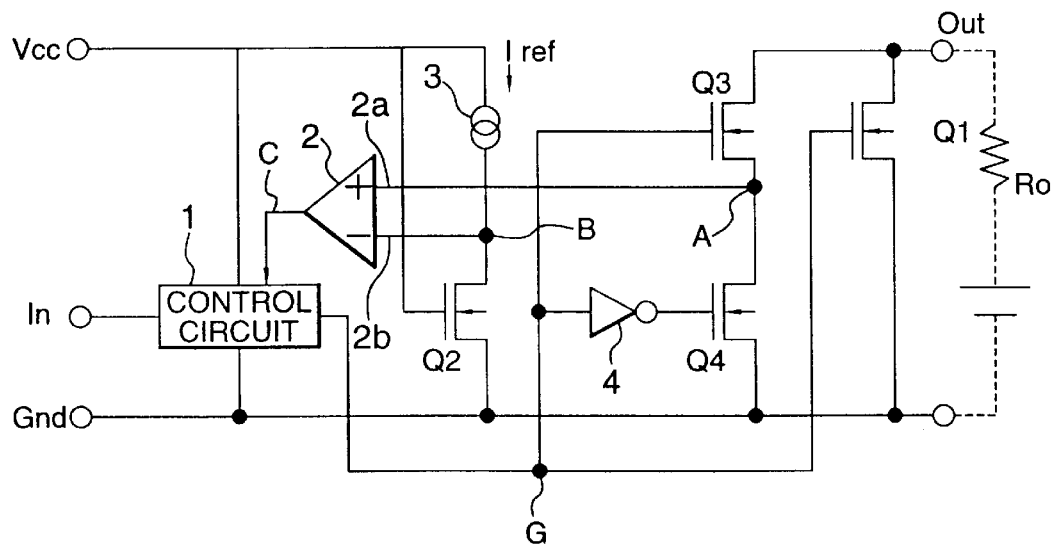
FIG. 2 is a circuit diagram showing a load drive circuit including an abnormal current detection circuit according to an embodiment of this invention.

Referring to FIG. 2, description will be made about a load drive circuit including an abnormal current detection circuit according to an embodiment of this invention.

As illustrated in FIG. 2, a load drive circuit mainly includes a control circuit 1, a comparator circuit 2, a constant current supply 3, an output transistor Q1, a second transistor Q2, a third transistor Q3, a fourth transistor Q4 and an inverter 4.

In this event, the control circuit 1 is connected a power supply Vcc and a ground terminal Gnd, respectively. Further, the control circuit 1 is given an input signal and an output signal of the comparator circuit 2. In this case, the comparator circuit 2 has a first input 2a and a second input 2b.

Herein, the first input 2a of the comparator circuit 2 is connected to a connection point A between the third transistor Q3 and the fourth transistor Q4 while the second input 2b of the comparator circuit 2 is connected to a connection point B between the constant current supply 3 and the second transistor Q2.

In this event, the abnormal current detection circuit is composed of the comparator circuit 2, the constant current supply 3, the third transistor Q3, the fourth transistor Q4 and the inverter 4.

With such a structure, the control circuit 1 operates on the basis of the power source Vcc. More specifically, when the output signal from the comparator circuit 2 is put in to a low level (thereinafter, abbreviated to a L level), the control circuit 1 outputs a signal corresponding to the input signal which is given to an input terminal In, and supplies the corresponding signal to the gate terminal of the output transistor Q1. Thereby, the output transistor Q1 carries out an ON-OFF control operation.

On the other hand, when the output signal from the comparator circuit 2 is put in to a high level (thereinafter, abbreviated to an H level), the control circuit 1 outputs the L level to turn off the output transistor Q1 irrelevant to the input signal from the input terminal In.

Herein, it is to be noted that the output transistor Q1 is formed by an N-channel MOS-FET. In this event, the source terminal of the output transistor Q1 is grounded while the drain terminal is connected to an output. Out. The output Out is connected to an external power supply via a load resistor Ro.

The above second transistor Q2 exhibits the characteristics similar to the output transistor Q1 because both transistors Q1 and Q2 are manufactured through the same process and are similar in structure to each other. Namely, the characteristics are equal to each other per a channel width, and the second transistor Q2 has a smaller channel width. In this event, the source terminal of the second transistor Q2 is grounded to the Gnd while the gate terminal of the second transistor Q2 is connected to the power supply Vcc. Under this condition, the second transistor Q2 is normally or always put into an ON state so that an output current is supplied the drain terminal from the constant current supply 3.

Moreover, the third transistor Q3 and the fourth transistor Q4 is connected in serial between the drain terminal and the source terminal of the output transistor Q1. In this event, each of the third transistor Q3 and the fourth transistor Q4 is also formed by the N-channel MOS-FET.

As mentioned before, the drain terminal (the point B) of the second transistor Q2 is connected the second input 2b of the comparator circuit 2. On the other hand, the connection point (the point A) between the third transistor Q3 and the fourth transistor Q4 is connected to the first input 2a of the comparator 2.

Further, the gate terminal of the third transistor Q3 is commonly connected to the gate terminal of the output transistor Q1 so that the third transistor Q3 perform the ON-OFF operation in synchronism with the output transistor Q1. Further, the signal of the gate terminal of the output transistor Q1 is reversely given to the gate terminal of the fourth transistor Q4 by the use of the inverter 4.

With such a structure, when the load resistor Ro and the external power supply are normal, and a normal current flows through the output transistor Q1, the point A is substantially equal to the voltage of the drain terminal of the output transistor Q1. Consequently, the voltage of the point A is lower than that of the point B.

On the other hand, when the load resistor Ro and the external power supply are abnormal and large current flows through the output transistor Q1, the voltage of the point A also becomes large. Therefore, if the current value for determining as the abnormality is selected by the constant current supply 3 in advance, the comparator circuit. 2 outputs the H level when the current of the output transistor Q1 is excessively large. The control circuit 1 puts the gate voltage of the output transistor Q1 to the L level in response to the above signal. Consequently, a protection circuit is structured so as to cut off the output transistor Q1.

However, in the above structure, a high voltage is often generated for excessively short duration at the point A in accordance with the combination of the switching characteristic of the output transistor Q1, the third transistor Q3 and the fourth transistor Q4 even when an excessively large current does not flow through the output transistor Q1 during the transitional duration. When the control circuit 1 operates in accordance with such an excessively short duration, the control circuit 1 can not carry out the predetermined control operation. In this case, a delay circuit can be included so as to ignore the signal of the excessively short duration.

Figure 3:
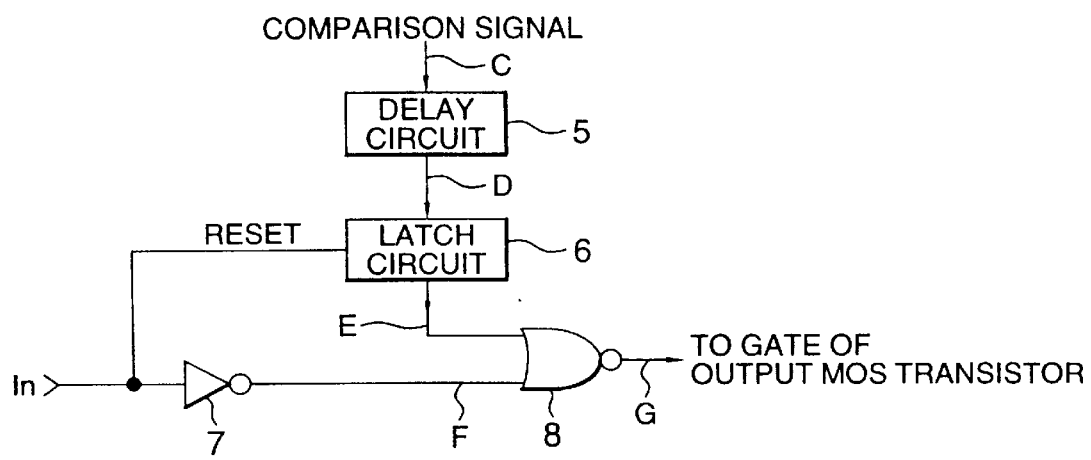
FIG. 3 is a block diagram showing a control circuit illustrated in FIG. 2.

Subsequently, description will be made about the control circuit including the above delay circuit, referring to FIG. 3.

The control circuit 1 is composed of a delay circuit 5, a latch circuit 6, and inverter 7 and a NOR circuit 8. With such a structure, the output signal C of the comparator circuit 2 is given to the delay circuit 5. An output signal of the delay circuit 5 is given to a latch circuit 6. Further, the latch circuit 6 is given the input signal via the input terminal In.

In this event, an output signal E of the latch circuit 6 and an output signal F of the inverter 7 are given to the NOR circuit 8, respectively. Herein, the signal F is reversed the input signal from the input terminal In by the use of the inverter 7.

Figure 4A:
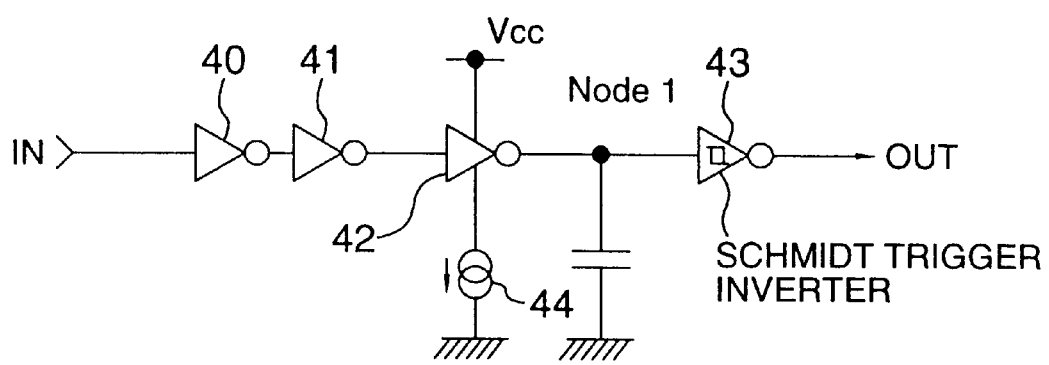
FIG. 4A is a circuit diagram showing a delay circuit illustrated in FIG. 3.

For instance, the delay circuit 5 is structured illustrated in FIG. 4A. Specifically, the delay circuit 5 is composed of three inverters 40, 41 and 42, a Schmidt Trigger inverter 43, a constant current supply 44, and a capacitor 45. In this event, a power supply Vcc and the constant current supply 44 are connected to the inverter 42. Further, the capacitor 45 is connected to a Node 1.

Figure 4B:
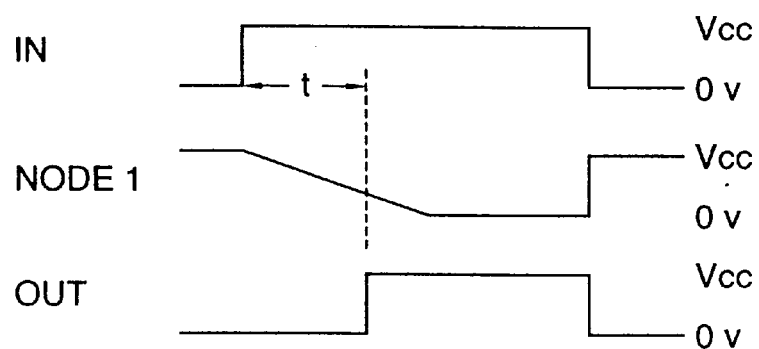
FIG. 4B is a timing chart of a delay circuit illustrated in FIG. 4A.

As shown in FIG. 4B, the delay circuit 5 omits a signal which is shorter than a delay time t. A signal which has a larger pulse width than the delay time t is outputted at a rise timing which is delayed with the delay time t.

The latch circuit 6 is put into the L level which is an initial state of the output irrelevant to the signal from the delay circuit 5 when the input signal from the input terminal In is put into the L level.

Subsequently, when the signal from the input terminal In is put into the H level, the latch circuit 6 becomes a wait state from the delay circuit 5. When the H level signal is given from the delay circuit 5, the output of the latch circuit 6 is put into the H level, and thereafter, the H level is kept until the input signal from the input terminal In becomes the L level.

Subsequently, description will be made about an operation of the control circuit 1 with a timing chart illustrated in FIG. 5.

First, the input terminal In is put into the L level. Namely, the latch circuit output point (thereinafter, abbreviated to an E point) is put into the L level. Further, the output point (thereinafter, abbreviated to an F point) of the inverter 7 is put into the H level. Namely, the gate terminal point (thereinafter, abbreviated to a point G) of the output transistor Q1 is put into the L level.

On this condition, the output transistor Q1 is turned off. At this time, the voltage of the point is equal to 0 V because the transistor Q3 is turned off.

In the timing To, when the signal of the input terminal In is changed into the H level, the F point is changed into the L level, and the G point is changed into the H level. Consequently, the output transistor Q1 and the third transistor Q3 are turned on while the fourth transistor Q4 is turned off. In this event, the high immediate voltage often occurs at the point A when the transistors Q1, Q3 and Q4 are in the transitional duration of the switching.

Figure 5:
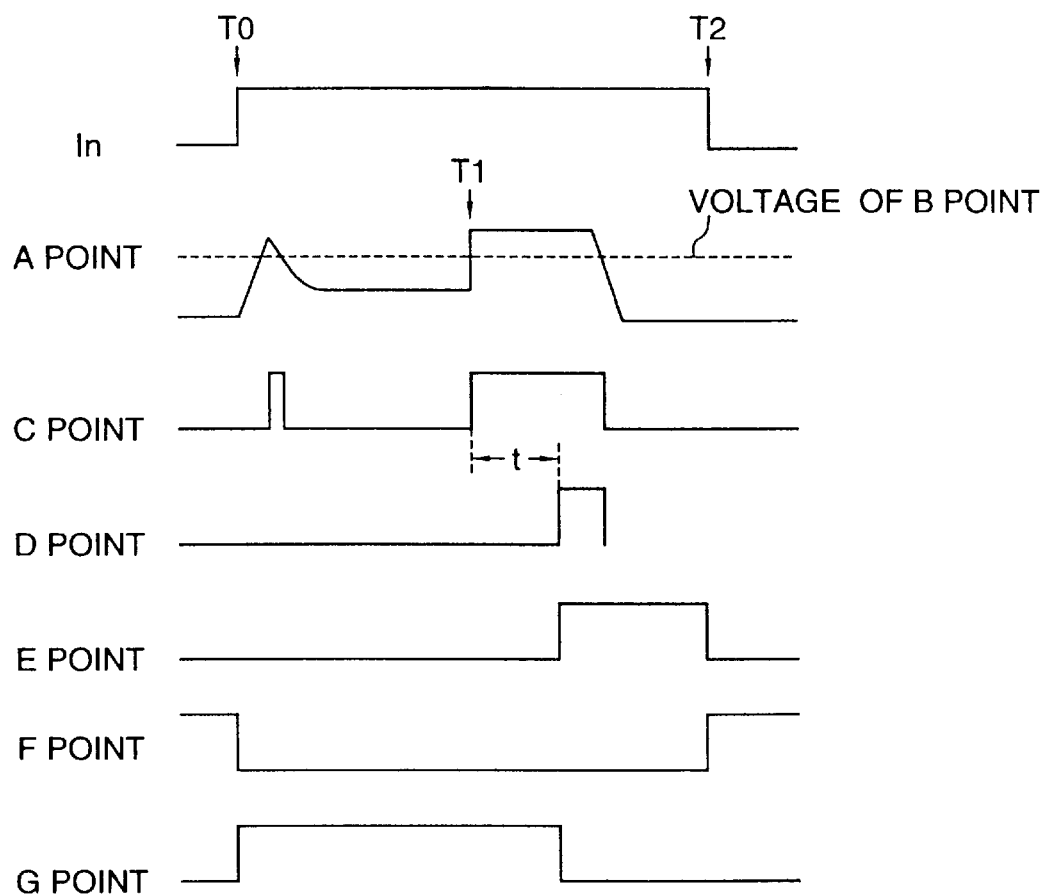
FIG. 5 is a timing chart of a control circuit illustrated in FIG. 3

As shown in FIG. 5, after the voltage of the point A is immediately exceeds the voltage of the point B, the voltage is kept to the predetermined voltage at which the normal current flows through the output transistor Q1 and which is lower the voltage of the point B.

At this time, the output (thereinafter, abbreviated to a C point) of the comparator circuit 2 immediately becomes the H level, and soon turns back to the L Level. However, the pulse width of this C point is smaller than the delay time t of the delay circuit 5 in the output point (thereinafter, abbreviated to a D point) of the delay circuit 5. Consequently, the voltage of the C point is kept to the L level, and therefore the E point is also kept to the L level.

Subsequently, when the load resistor Ro or the external power supply becomes abnormal in the timing T1, and the current excessively flows through the output transistor Q1, the high voltage which exceeds the B point is generated at the A point. Thereby, the C point is changed into the H level to keep the H level longer than the delay time t.

Consequently, the D point is delayed at the delay time t by the delay circuit 5 to become the H level, and the E point is changed into the H level. Therefore, the G point is put into the L level to cut off the output transistor Q1. When the output transistor Q1 is turned off, the voltage of the point becomes 0V, the C point becomes the L level and the E point is kept to the H level.

Thereafter, the above-mentioned condition is kept regardless of whether or not the abnormality of the external power supply continues or returns to the normality.

Subsequently, the input terminal In is changed into the L level, the latch circuit output point (E point) is changed to the L level. At the same time, the output point F of the inverter 7 is changed into the H level. Consequently, the output transistor Q1 is kept into the OFF state. This state corresponds to the above-mentioned initial state.

In this event, if the load resistor Ro is first short-circuited, the operation after the timing T1 is carried out in connection with the operation of the timing T0 which is mentioned before.

Although the N-channel MOSFET is used each of the output transistor Q1 and the second transistor Q2 in the above-mentioned embodiment, a P-channel MOSFET may be used by giving a negative power supply as the power supply Vcc or the external power supply.

What is claimed is:

1. An abnormal current detection circuit for detecting an abnormal current which flows through an first output transistor which is connected to an external power supply via a load resistor, comprising:
    a second transistor which is connected to a power supply;
    a constant current supply which supplies a constant current into said second transistor in accordance with a lower limit for determining a current which flows through said first output transistor as the abnormal current,
    a third transistor which is connected to said first output transistor and which performs an ON-OFF operation in synchronism with said first output transistor;
    a fourth transistor which is connected to said third transistor in serial and which performs the ON-OFF operation opposite to said first output transistor, and
    a comparator circuit which has a first input and a second input and in which a first connection point between said second transistor and said constant current supply is connected to the first input while a second connection point between said third transistor and said fourth transistor is connected to the second input.

2. A circuit as claimed in claim 1, wherein:
    each of said first, second, third and fourth transistors comprises a MOS transistor,
    said second MOS transistor has a source terminal which is grounded and a gate terminal which is connected to said power supply,
    said first output transistor has a drain terminal and a source terminal,
    said third MOS transistor is connected between the drain terminal and the source terminal of said first output transistor and which performs an ON-OFF operation in synchronism with said first output transistor.

3. A circuit as claimed in claim 1, wherein:
    said second transistor is similar in characteristic to said first output transistor.

4. A circuit as claimed in claim 1, wherein:
    the constant current is set to a similarity ratio between said first output transistor and said second transistor.

5. A circuit as claimed in claim 2, wherein:
    the drain terminal of said first MOS output transistor is connected to said external power supply as an output terminal while the source terminal of said first output transistor is grounded.

6. A circuit as claimed in claim 1, wherein:
    said fourth MOS transistor includes an inverter.

7. A load drive circuit for driving a load, comprising
    a first output transistor which is connected to the load to detect an abnormal current which flows through said first output transistor;
    a second transistor which is connected to a power supply;
    a constant current supply which supplies a constant current into said second transistor in accordance with a lower limit for determining a current which flows through said first output transistor as the abnormal current,
    a third transistor which is connected to said first output transistor and which performs an ON-OFF operation in synchronism with said first output transistor;
    a fourth transistor which is connected to said third transistor in serial and which performs the ON-OFF operation opposite to said first output transistor;
    a comparator circuit which has a first input and a second input and in which a first connection point between said second transistor and said constant current supply is connected to the first input while a second connection point between said third transistor and said fourth transistor is connected to the second input;
    a control circuit which is connected to said comparator circuit and said first output transistor and which an input signal is given.

8. A circuit as claimed in claim 7, wherein:
    each of said first, second, third and fourth transistors comprises a MOS transistor,
    said second MOS transistor has a source terminal which is grounded and a gate terminal which is connected to said power supply,
    said first output transistor has a drain terminal and a source terminal,
    said third MOS transistor is connected between the drain terminal and the source terminal of said first output transistor and which performs an ON-OFF operation in synchronism with said first output transistor.

9. A circuit as claimed in claim 7, wherein:
    said second transistor is similar in characteristic to said first output transistor.

10. A circuit as claimed in claim 7, wherein:
    the constant current is set to a similarity ratio between said first output transistor and said second transistor.

11. A circuit as claimed in claim 8, wherein:
    the drain terminal of said first output transistor is connected to the load as an output terminal while the source terminal of said first output transistor is grounded.

12. A circuit as claimed in claim 7, wherein:
    said fourth transistor includes an inverter.

13. A circuit as claimed in claim 8, wherein;

said control circuit is connected to the gate terminal of said first output MOS transistor.

14. A circuit as claimed in claim 8, wherein:

said control circuit supplies a predetermined signal to said first MOS output transistor to cut off said first output MOS transistor when said comparator circuit determines that a voltage at the second connection point is higher than that of the first connection point.

15. A circuit as claimed in claim 14, wherein:

said first output MOS transistor is an N-channel type, and said control circuit supplies a low level signal as the predetermined signal to the gate terminal of said first output MOS transistor to turn off said first output MOS transistor.

16. A circuit as claimed in claim 7, wherein:

said control circuit includes a delay circuit which is given an output of said comparator circuit, a latch circuit which is connected said delay circuit, a NOR circuit which is connected to said latch circuit, and an inverter which connected to said NOR circuit and which is given an input signal.

* * * * *